(12) United States Patent
Kaneyama et al.

(10) Patent No.: US 6,913,781 B2
(45) Date of Patent: Jul. 5, 2005

(54) SUBSTRATE PROCESSING APPARATUS AND METHOD INCLUDING A DEVICE FOR APPLYING A COATING AND A DEVICE FOR MEASURING THE FILM QUALITY OF THE COATING

(75) Inventors: Koji Kaneyama, Kyoto (JP); Akihiro Hisai, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/170,776

(22) Filed: Jun. 12, 2002

(65) Prior Publication Data

US 2002/0192358 A1 Dec. 19, 2002

(30) Foreign Application Priority Data

Jun. 19, 2001 (JP) ......................................... 2001-185129

(51) Int. Cl.⁷ ........................... B05D 3/02; B05D 11/00; B05C 9/14
(52) U.S. Cl. ................... 427/9; 427/8; 427/10; 427/240; 118/665; 118/668; 118/712; 118/52
(58) Field of Search ........................... 427/8, 9, 10, 240; 118/52, 712, 665, 668

(56) References Cited

U.S. PATENT DOCUMENTS 5,393,624 A * 2/1995 Ushijima ..................... 430/30
6,376,013 B1 * 4/2002 Rangarajan et al. ......... 427/240

FOREIGN PATENT DOCUMENTS

JP            06-074717      * 3/1994

* cited by examiner

Primary Examiner—Katherine Bareford
(74) Attorney, Agent, or Firm—Ostrolenk, Faber, Gerb & Soffen, LLP (57) ABSTRACT

A substrate processing apparatus is provided with five inspection devices that perform inspections of different kinds to a substrate. Among the five kinds of inspections, the film quality is measured after resist coating, and before post-coating heat-treatment. As the film quality, the amount of solvent remaining in a resist film is measured. The film thickness is measured after heat-treatment following resist coating and before exposure. Meanwhile, the line width and the superposition precision are measured and macroscopic defect inspection is performed after post-development heat-treatment and before the substrate is returned to an indexer.

16 Claims, 6 Drawing Sheets

SUBSTRATE PROCESSING APPARATUS AND METHOD INCLUDING A DEVICE FOR APPLYING A COATING AND A DEVICE FOR MEASURING THE FILM QUALITY OF THE COATING

BACKGROUND OF THE INVENTION

1. Field of the Invention

The present invention relates to a substrate processing apparatus and a substrate processing method for performing a prescribed processing to a substrate such as a semiconductor wafer, a glass substrate for a liquid crystal display, a glass substrate for a photomask, and a substrate for an optical disc and inspecting the substrate.

2. Description of the Background Art

Products such as a semiconductor device and a liquid crystal display are produced by subjecting a substrate such as a semiconductor wafer, a glass substrate for a liquid crystal display, a glass substrate for a photomask, and a substrate for an optical disc to a series of processings. The processings include cleaning, resist-coating, exposure, development, etching, forming an interlayer insulating film, heat-treatment and dicing. In order to maintain the qualities of the semiconductor products or the like, the substrates must be inspected for various aspects to verify the qualities.

For controlling a resist coater in particular, the resist film thickness is controlled for the purpose of keeping the line width (Critical Dimension) from fluctuating. The resist film thickness is controlled by inspection using a thicknessmeter provided in the resist coater, or sampling inspection. When a value measured using the thicknessmeter is outside the range of a prescribed target control value, for example, the number of revolutions of the spin coater that applies resist while rotating the substrate is changed in order to control the thickness.

Meanwhile, the demand for higher line width uniformity has grown with recent reduction in the processing dimension. At present, a KrF (krypton fluoride) excimer laser (wavelength: 248 nm) is mainly used as a light source for exposure in producing on a substrate a pattern whose line width is in the range from 0.18 to 0.13 $\mu$m. There is a prospect for the use of an ArF (argon fluoride) excimer laser (wavelength: 196 nm) for a line width in the range from 0.13 to 0.1 $\mu$m or an $F_2$ (fluorine dimer) excimer laser (wavelength: 157 nm) for a line width in the range from 0.1 to 0.07 $\mu$m. More improvement in the line width precision is called for as well.

If however the film thickness is controlled to be uniform by the conventional inspection by the film thickness measurement, difference in the process caused by different coating conditions or heat-treatment conditions makes it difficult to keep the line width uniform after development.

SUMMARY OF THE INVENTION

It is an object of the present invention to provide a substrate processing apparatus capable of performing an appropriate inspection for reducing fluctuations in the line width of a pattern formed at a film on a substrate.

Another object of the present invention is to provide a substrate processing method capable of performing an appropriate inspection for reducing fluctuations in the line width of a pattern formed at a film on a substrate.

A substrate processing apparatus according to one aspect of the present invention comprises one or more processing devices each performing a prescribed processing to a substrate, at least one of the one or more processing devices includes a coater that coats the substrate with a processing liquid, and a film quality measuring device that measures the film quality of the processing liquid applied on the substrate by the coater.

In the substrate processing apparatus, a prescribed processing is performed to a substrate in one or more processing devices, and the substrate is coated with a processing liquid in at least one of the one or more processing devices. The film quality of the processing liquid applied on the substrate is measured in the film quality measuring device.

This film quality measurement allows fluctuations in the line width after forming the pattern to be controlled, which is not allowed only by controlling the film thickness. Thus, fluctuations in the line width can be reduced for different sequences of processing steps.

The processing liquid may include a solvent and a solute, and the film quality measuring device may measure the amount of solvent remaining in the film of the processing liquid on the substrate as the film quality of the processing liquid.

In this way, the amount of solvent remaining in the film of the processing liquid that affects the uniformity of the line width after forming the pattern is measured, so that fluctuations in the line width after forming the pattern can be controlled.

The coater may coat the substrate with a resist solution as the processing liquid, and the film quality measuring device may measure the amount of solvent remaining in the film of the resist solution on the substrate as the film quality.

In this way, the amount of solvent remaining in the film of the resist solution that affects a chemical reaction (catalysis) by heat-treatment after exposure is measured, so that fluctuations in the line width after development can be controlled.

The substrate processing apparatus may further comprise a controller that controls a processing condition in at least one of the one or more processing devices based on a result of measurement by the film quality measuring device.

In the substrate processing apparatus, the film quality measuring device measures the film quality of the processing liquid on the substrate, and a processing condition in at least one of the one or more processing devices is controlled based on a result of film quality measurement.

In this way, the result of film quality measurement can be used for the operation of each processing device, so that fluctuations in the line width after forming the pattern can be reduced, which is not allowed only by controlling the film thickness.

The controller may control a processing condition in a processing before measurement based on a result of measurement by the film quality measuring device.

In this way, the processing condition in the processing before measurement is controlled based on the result of film quality measurement, so that feedback control is performed to substrates to be processed after the measured substrate. Thus, fluctuations in the line width after forming the pattern can be reduced.

The controller may control a processing condition in a processing after measurement based on a result of measurement by the film quality measuring device.

In this way, the processing condition in the processing after measurement is controlled based on the result of film quality measurement, so that feed forward control is performed to the measured substrate. Thus, fluctuations in the line width after forming the pattern can be controlled.

The one or more processing devices may further include another processing device that performs another processing to a substrate processed by the coater, and the film quality measuring device may be provided in the coater or the other processing device.

In the substrate processing apparatus, after a substrate is coated with a processing liquid by the coater, another processing is performed in another processing device. The film quality measurement device provided in the coater or the other processing device measures the film quality of the processing liquid on the substrate.

In this way, the film quality of the processing liquid on the substrate can be measured during the processing in the processing device having the film quality measuring device, so that processing conditions such as the ending time of the processing and the temperature may be controlled. Therefore, highly responsive film quality control is enabled and fluctuations in the line width after forming the pattern can be reduced.

The substrate processing apparatus may further comprise a transportation device that transports a substrate to the one or more processing devices, and the film quality measuring device may be provided at the transportation device.

In the substrate processing apparatus, the transportation device is provided to transport a substrate before or after a processing in one or more processing devices or between one processing and another processing. Therefore, the film quality of the processing liquid on the substrate is measured during the transportation of the substrate by the transportation device.

In this way, the film quality may be measured when a substrate not being subjected to the processing in one or more processing devices is transported, so that time for film quality measurement does not have to be provided additionally to time for each processing. Therefore, the film quality can efficiently be measured.

The substrate processing apparatus may further comprise a waiting location to keep a substrate to wait, and the film quality measuring device may be provided in the waiting location.

In the substrate processing apparatus, a substrate is kept in the waiting location when it waits for the next processing. When the substrate is in the waiting location, the film quality of the processing liquid on the substrate is measured by the film quality measuring device provided in the waiting location.

In this way, time for film quality measurement does not have to be provided additionally to time for each processing, so that the film quality can efficiently be measured.

The film quality measuring device may measure a film quality during or after the processing by the coater, or before, during or after the processing by the other processing device.

When the film quality is measured during a processing by the coater or another processing device, the film quality of the processing liquid on the substrate can be measured during the processing in the processing device having the film quality measuring device, so that processing conditions such as the ending time of the processing and the temperature can be controlled. Therefore, highly responsive film quality control is enabled and fluctuations in the line width after forming the pattern can be reduced.

When the film quality is measured before a processing by the coater or another processing device, a processing condition in the processing after measurement can be controlled based on a result of film quality measurement, so that feed forward control is performed to a measured substrate. Thus, fluctuations in the line width after forming the pattern can be reduced.

When the film quality is measured after a processing by the coater or another processing device, a processing condition in the processing before measurement can be controlled based on a result of film quality measurement, so that feedback control is performed to substrates to be processed after the measured substrate. Thus, fluctuations in the line width after forming the pattern can be reduced.

A substrate processing method using one or more processing devices each performing a prescribed processing to a substrate according to another aspect of the present invention comprises the steps of coating the substrate with a processing liquid using at least one of the one or more processing devices, and measuring the film quality of the processing liquid applied on the substrate.

In the substrate processing method, a substrate is coated with a processing liquid, and the film quality of the processing liquid applied on the substrate is measured. This film quality measurement allows fluctuations in the line width after forming the pattern to be controlled, which is not allowed only by controlling the film thickness. Thus, fluctuations in the line width can be reduced for different sequences of processing steps.

The processing liquid may include a solvent and a solute, and the step of measuring the film quality may include measuring the amount of solvent remaining in the film of the processing liquid on the substrate as the film quality of the processing liquid.

In this way, the amount of solvent remaining in the film of the processing liquid that affects the uniformity of the line width after forming the pattern is measured, so that fluctuations in the line width after forming the pattern can be controlled.

The step of coating with the processing liquid may include coating the substrate with a resist solution as the processing liquid, and the step of measuring the film quality may include measuring the amount of solvent remaining in the film of the resist solution on the substrate as the film quality.

In this way, the amount of solvent remaining in the film of the resist solution that affects a chemical reaction (catalysis) by heat-treatment after exposure is measured, so that fluctuations in the line width after development can be controlled.

The substrate processing method may further include the step of controlling a processing condition in at least one of the one or more processing devices based on a measurement result of the film quality.

In the substrate measurement method, the film quality of the processing liquid on the substrate is measured in at least one of the one or more processing devices, so that a processing condition in the at least one of the one or more processing devices is controlled based on the result of film quality measurement.

In this way, the result of film quality measurement can be used for the operation of each processing device, so that fluctuations in the line width after forming the pattern can be reduced, which is not allowed only by controlling the film thickness.

The step of controlling may include controlling a processing condition in a processing before measurement based on a measurement result of the film quality.

In this way, a processing condition in a processing before measurement is controlled based on a result of film quality measurement, so that feedback control is performed to substrates to be processed after the measured substrate. Thus, fluctuations in the line width after forming the pattern can be reduced.

The step of controlling may include controlling a processing condition in a processing after measurement based on the measurement result of the film quality.

In this way, a processing condition in a processing after measurement is controlled based on a result of film quality measurement, so that feed forward control is performed to the measured substrate. Thus, fluctuations in the line width after forming the pattern can be controlled.

The substrate processing method may further comprise the step of performing another processing to the coated substrate by at least another of the one or more processing devices, and the step of measuring the film quality may include measuring the film quality in the at least one or the at least another of the one or more processing devices.

In the substrate processing method, after a substrate is coated with a processing liquid by at least one processing device, another processing is performed in another processing device. The film quality of the processing liquid on the substrate is measured in the at least one processing device or the other processing device.

In this case, the film quality of the processing liquid on the substrate during a processing in the at least one processing device can be measured, so that a processing condition such as the ending time of the processing and the temperature may be controlled, and highly responsive film quality control is enabled. Thus, fluctuations in the line width after forming the pattern can be controlled.

The substrate processing method may further comprise the step of transporting a substrate to the one or more processing devices by a transportation device, and the step of measuring the film quality may include measuring the film quality in the transportation device.

In the substrate processing method, a substrate is transported by the transportation device before or after a processing in the one or more processing devices or between one processing and another processing, so that the film quality of the processing liquid on the substrate is measured during the transportation of the substrate by the transportation device.

In this way, the film quality may be measured when a substrate not being subjected to the processing in the one or more one processing devices is transported, so that time for film quality measurement does not have to be provided additionally to time for each processing, and the film quality can efficiently be measured.

The step of measuring the film quality includes measuring the film quality in a waiting location to keep a substrate to wait.

In the substrate processing method, a substrate is kept in the waiting location when it waits for the next processing. When the substrate is in the waiting location, the film quality of the processing liquid on the substrate is measured by the film quality measuring device provided in the waiting location.

In this way, time for film quality measurement does not have to be provided additionally to time for each processing, so that the film quality can efficiently be measured.

The step of measuring the film quality may include measuring the film quality during or after coating with a processing liquid, or before, during or after the other processing.

When the film quality of the processing liquid is measured during a processing in at least one processing device or another processing device, processing conditions such as the ending time of the processing and the temperature may be controlled. Therefore, highly responsive film quality control is enabled and fluctuations in the line width after forming the pattern can be controlled.

When the film quality is measured before a processing by at least one processing device or another processing device, a processing condition in the processing after measurement can be controlled based on a result of film quality measurement, so that feed forward control is performed to the measured substrate. Thus, fluctuations in the line width after forming the pattern can be reduced.

When the film quality is measured after a processing by at least one processing device or another processing device, a processing condition in the processing before measurement can be controlled based on a result of film quality measurement, so that feedback control is performed to substrates to be processed after the measured substrate. Thus, fluctuations in the line width after forming the pattern can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
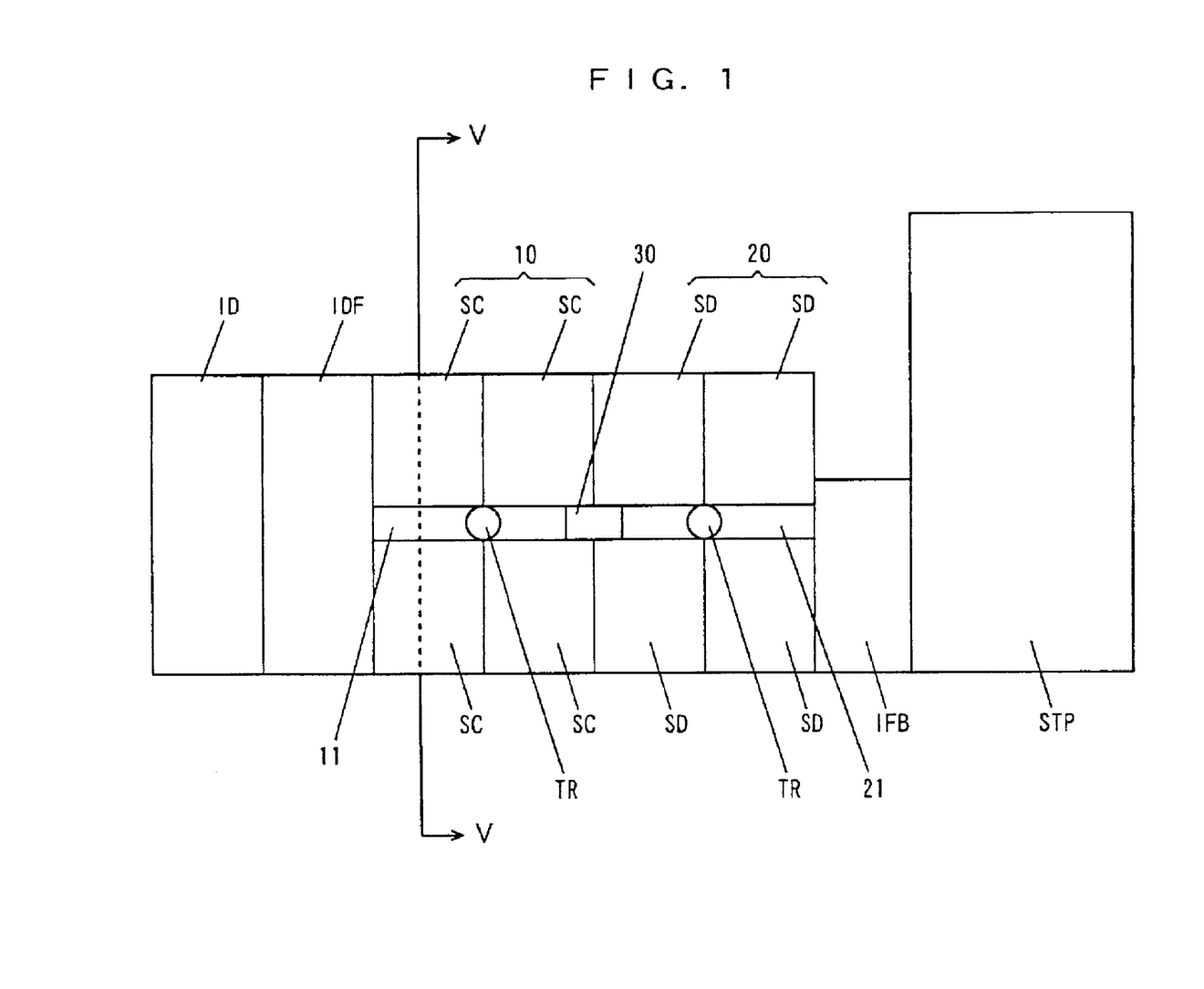
FIG. 1 is a plan view of the arrangement of elements in a substrate processing apparatus according to one embodiment of the present invention.
Figure 2:
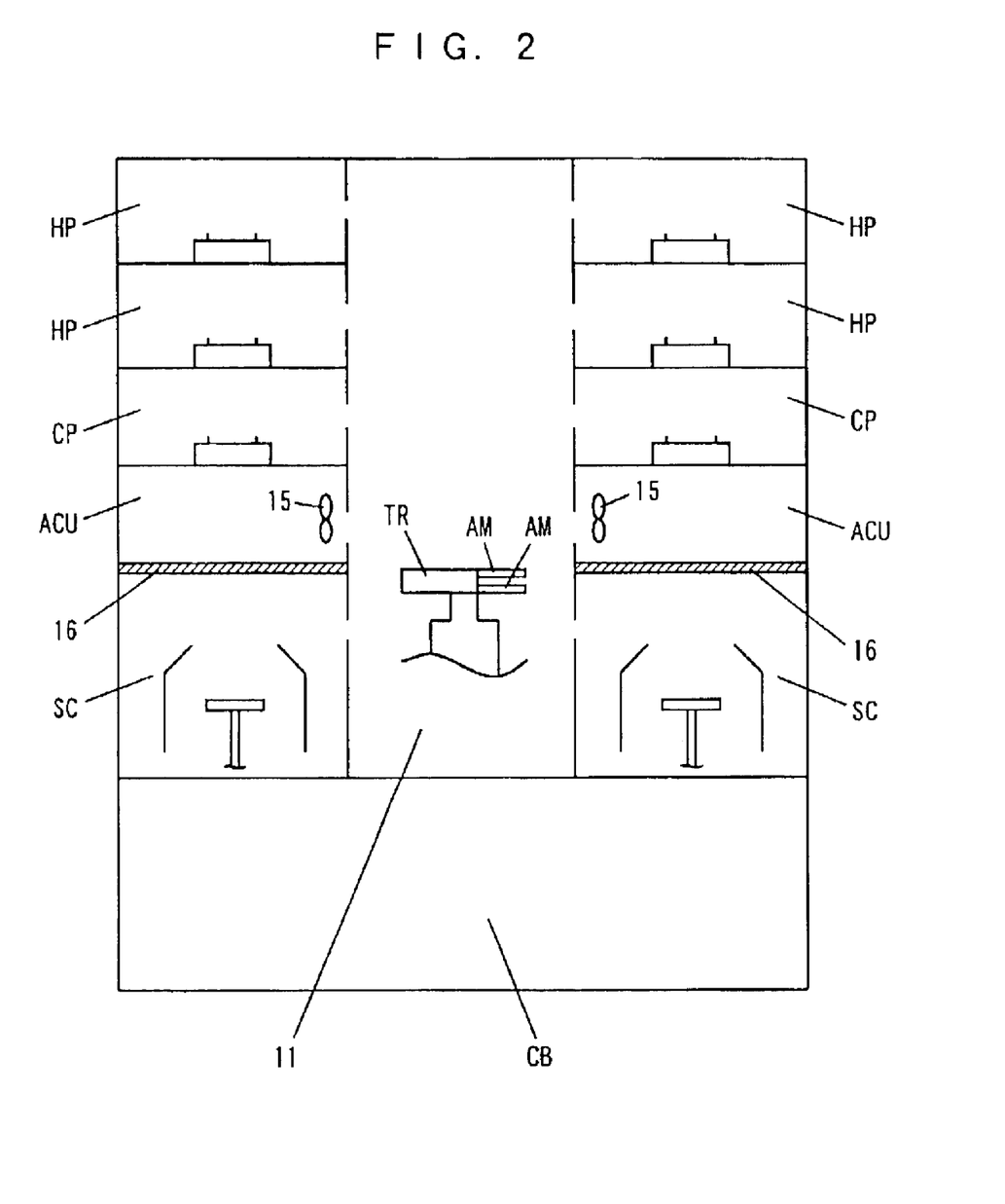
FIG. 2 is a vertical sectional view of the substrate processing apparatus in FIG. 1 taken along line V—V.

FIG. 1 is a plan view of the arrangement of elements in a substrate processing apparatus according to one embodiment of the present invention. FIG. 2 is a vertical sectional view of the substrate processing apparatus in FIG. 1 taken along line V—V.

The substrate processing apparatus performs coating of a substrate with photoresist and development of the photoresist. The apparatus includes an coating unit 10 that performs resist-coating, a developing unit 20 that performs development, an indexer ID that delivers a substrate to these processing units, an indexer delivery unit IDF and an interface IFB.

The substrate processing apparatus includes an inspection unit 30 provided at the joint portion between the coating unit 10 and the developing unit 20. An exposure unit (stepper) STP for exposure processing is provided in contact with the interface IFB at the outside of the substrate processing apparatus.

A transportation robot TR is provided in a transportation path 11 in the coating unit 10, and there are four coaters SC, two by two on each side of the transportation path 11. A clean airflow from above (downflow) is formed in the transportation path 11. Each coater SC is a spin coater that drops photoresist on the main surface of a substrate while rotating the substrate, so that uniform resist-coating can be performed.

As shown in FIG. 2, there is a heat-treatment device above each coater SC. The heat-treatment device includes three layers, i.e., the layers of one cooling device CP and two heating devices HP in this order from below. The heating device HP is a so-called hot plate that heats a substrate to a prescribed temperature. The cooling device CP is a so-called cooling plate that cools a substrate to a prescribed temperature.

An air conditioner ACU is provided immediately above each coater SC and between the coater SC and the cooling device CP to supply clean air to the coater SC. The air conditioner ACU includes a fan 15 and a ULPA filter 16. The fan 15 is operated to force clean air to be drawn from the downflow formed in the transportation path 11 into the air conditioner ACU. The clean air drawn into the air conditioner ACU is supplied to the coater SC after fine particles is removed by the ULPA filter 16.

There is a chemical cabinet CB under the coaters SC. The chemical cabinet CB stores for example a bottle for photoresist or a pipe used to supply the photoresist.

The transportation robot TR is driven by a driving mechanism (not shown) and can move up and down in the vertical direction and rotate around an axis in the vertical direction. The transportation robot TR includes a transportation arm AM that advances/withdraws in a horizontal plane as it holds a substrate and thus accesses the coater SC, the cooling device CP and the heating devices HP. Using the transportation robot TR, a substrate can be inserted/taken out in/from each of the processing devices in the coating unit 10. Note that the transportation arm AM is preferably a double-arm device to improve the throughput.

Meanwhile, in the developing unit 20 shown in FIG. 1, there are four developers SD, two by two on each side of a transportation path 21 in which a transportation robot TR is provided. The developer SD is a spin developer that supplies a developing agent onto a substrate after exposure for development. The developing unit 20 is connected with the coating unit 10 so that the transportation path 11 is aligned with the transportation path 21.

Similarly to the coating unit 10, there is a heat-treatment device above each developer SD. The device similarly includes three layers, i.e., the layers of one cooling device CP and two heating devices HP in this order from below. There is an air conditioner ACU for supplying clean air to the developer SD, and a transportation robot TR having the same structure as that in the coating unit 10 is provided in the transportation path 21. Meanwhile, in the developing unit 20, a post-exposure baking device PEB partly replaces the heating device HP.

Note that according to the embodiment, both transportation robots TR in the coating unit 10 and developing unit 20 and the transportation paths 11 and 21 correspond to the transportation device.

The indexer ID includes carriers (not shown) that can store a plurality of substrates. The indexer ID delivers a substrate to be processed to the coating unit 10 or the like from a carrier and stores a processed substrate received from the coating unit 10, the developing unit 20 or the like in a carrier. Note that the carriers may be an OCs (Open Cassettes) where stored substrates are exposed to air or FOUPs (Front Opening Unified Pods) where substrates are stored in an enclosed space.

The indexer ID is connected with the coating unit 10 with the indexer delivery unit IDF therebetween. The indexer delivery unit IDF receives/delivers a substrate between the indexer ID and the coating unit 10. More specifically, the indexer delivery unit IDF is provided with a substrate transfer robot (not shown) which picks up a substrate yet to be processed stored in the carrier of the indexer ID and delivers the substrate to the transportation robot TR of the coating unit 10. The substrate transfer robot inserts a processed substrate received from the transportation robot TR into a carrier of the indexer ID.

The interface IFB is provided between the exposure unit STP and the developing unit 20. The interface IFB connects the exposure unit STP and the developing unit 20 to receive/deliver a substrate between them. More specifically, the interface IFP is provided with a substrate transfer robot and a buffer cassette (both not shown), thus receives a substrate coated with resist from the transportation robot TR of the developing unit 20 to insert the substrate in the exposure unit STP, and receives a substrate after exposure from the exposure unit STP to deliver the substrate to the transportation robot TR of the developing unit 20. The interface IFB may allow a substrate in a stand-by state to be withdrawn to the buffer cassette, so that the difference between the processing times in the exposure unit STP and the substrate processing apparatus can be adjusted.

The exposure unit STP irradiates a main surface of a photoresist-coated substrate with an excimer laser beam for example so that a predetermined pattern is formed by the exposure.

In the substrate processing apparatus according to the embodiment, an inspection unit 30 is provided at the joint portion between the coating unit 10 and the developing unit 20 and connected with both transportation paths 11 and 21.

Figure 3:
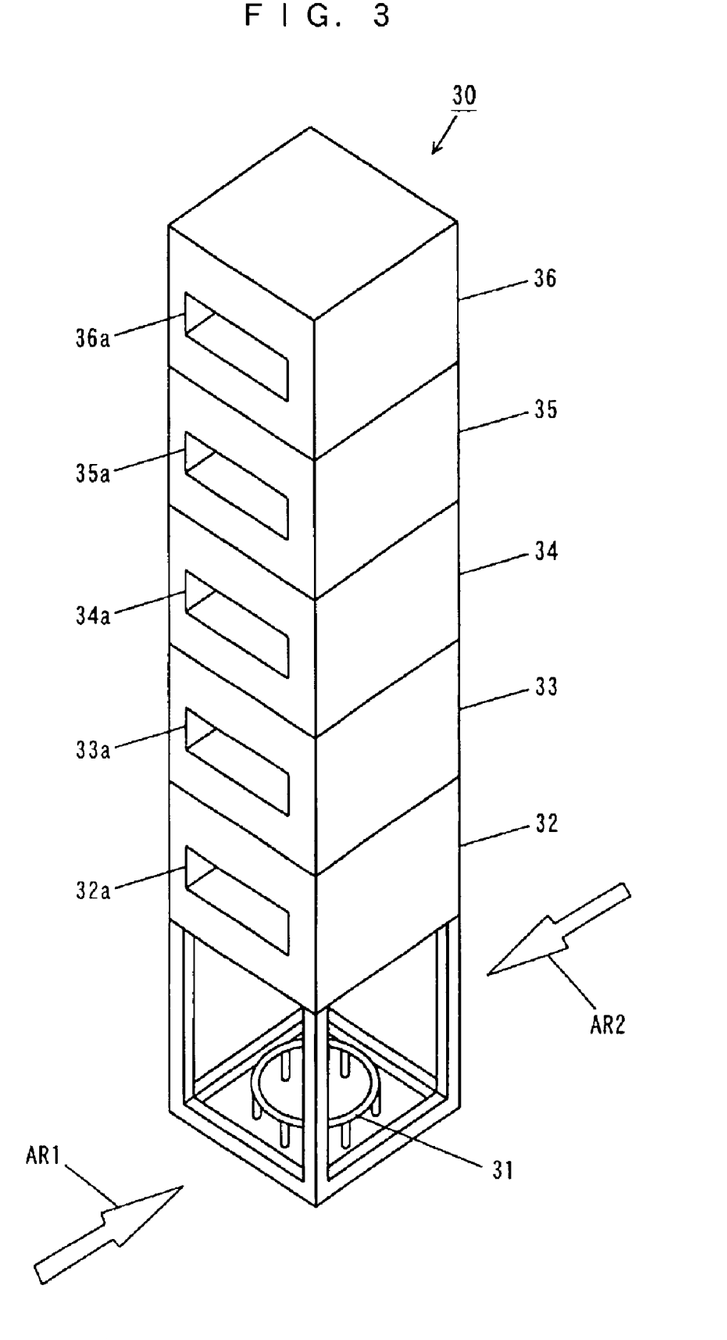
FIG. 3 is a perspective view of an inspection unit according to the embodiment.

FIG. 3 is a perspective view of the inspection unit 30 according to the embodiment. The inspection unit 30 includes a film quality measuring device 32, a film thickness measuring device 33, a line width measuring device 34, a superposition precision measuring device 35, and a macroscopic defect inspection device 36 in this order from below. Note that at the lowermost stage of the inspection unit 30 (under the film quality measuring device 32), a delivery platform 31 is provided.

As shown in FIG. 3, the transportation robots TR of the coating unit 10 and the developing unit 20 in FIG. 1 access the inspection unit 30 in the directions denoted by the arrows AR1 and AR2, respectively.

A substrate is placed on the delivery platform 31. As shown in FIG. 3, the periphery of the delivery platform 31 is open, and the transportation robots TR of the coating unit 10 and the developing unit 20 can exchange a substrate with each other through the delivery platform 31. Note however that the delivery platform 31 is used simply for thus exchanging a substrate between the transportation robots TR.

The film quality measuring device 32 is an inspection device that measures the film quality of photoresist applied on a substrate, in other words, the device measures the amount of solvent remaining in the film. The film quality measuring device 32 is provided with an inlet/outlet 32a at a side surface so that and the transportation robot TR of the coating unit 10 can insert/take out a substrate into/from the film quality measuring device 32 through the inlet/outlet 32a. There is a similar inlet/outlet (not shown) on the opposite side of the inlet/outlet 32a of the film quality measuring device 32 so that the transportation robot TR of the developing unit 20 can insert/take out a substrate into/from the film quality measuring device 32 from the inlet/outlet.

The film thickness measuring device 33 is an inspection device that measures the thickness of the photoresist applied on a substrate. The film thickness measuring device 33 is provided with an inlet/outlet 33a at a side surface so that the transportation robot TR of the coating unit 10 can insert/take out a substrate into/from the film thickness measuring device 33 through the inlet/outlet 33a. There is a similar inlet/outlet (not shown) on the opposite side of the inlet/outlet 33a of the film thickness measuring device 33 so that the transportation robot TR of the developing unit 20 can insert/take out a substrate into/from the film thickness measuring device 33 through the inlet/outlet. For example, the transportation robot TR of the coating unit 10 can insert a substrate coated with resist, the film thickness measuring device 33 can measure the thickness of the substrate, and the transportation robot TR of the developing unit 20 can take out the substrate after the inspection.

The line width measuring device 34 is an inspection device that measures the line width of a pattern formed on a substrate. The line width measuring device 34 is provided with an inlet/outlet 34a at a side surface so that the transportation robot TR of the coating unit 10 can insert/take out a substrate into/from the line width measuring device 34 through the inlet/outlet 34a. There is a similar inlet/outlet (not shown) on the opposite side of the inlet/outlet 34a of the line width measuring device 34 so that the transportation robot TR of the developing unit 20 can insert/take out a substrate into/from the line width measuring device 34 through the inlet/outlet. For example, the transportation robot TR of the developing unit 20 can insert a substrate after development, the line measuring device 34 can measure the line width of the substrate, and the transportation robot TR of the coating unit 10 can take out the substrate after the inspection.

The superposition precision measuring device 35 is an inspection device that measures the shift of a pattern formed on a substrate. The superposition precision measuring device 35 is provided with an inlet/outlet 35a at a side surface so that the transportation robot TR of the coating unit 10 can insert/take out a substrate into/from the superposition precision measuring device 35 through the inlet/outlet 35a. There is a similar inlet/outlet (not shown) on the opposite side of the inlet/outlet 35a of the superposition precision measuring device 35 so that the transportation robot TR of the developing unit 20 can insert/take out a substrate into/from the superposition precision measuring device 35 through the inlet/outlet.

The macroscopic defect inspection device 36 is an inspection device that determines the presence/absence of relatively large defects appearing on a substrate such as particles attached on the substrate. The macroscopic defect inspection device 36 is provided with an inlet/outlet 36a at a side surface so that the transportation robot TR of the coating unit 10 can insert/take out a substrate into/from the macroscopic defect inspection device 36 through the inlet/outlet 36a. There is a similar inlet/outlet (not shown) on the opposite side of the inlet/outlet 36a of the macroscopic defect inspection device 36. For example, the transportation robot TR of the developing unit 20 can insert/take out a substrate into/from the macroscopic defect inspection device 36 through the inlet/outlet.

As described above, according to the embodiment, there are the five inspection devices in the substrate processing apparatus that perform inspections of different kinds to a substrate.

Figure 4:
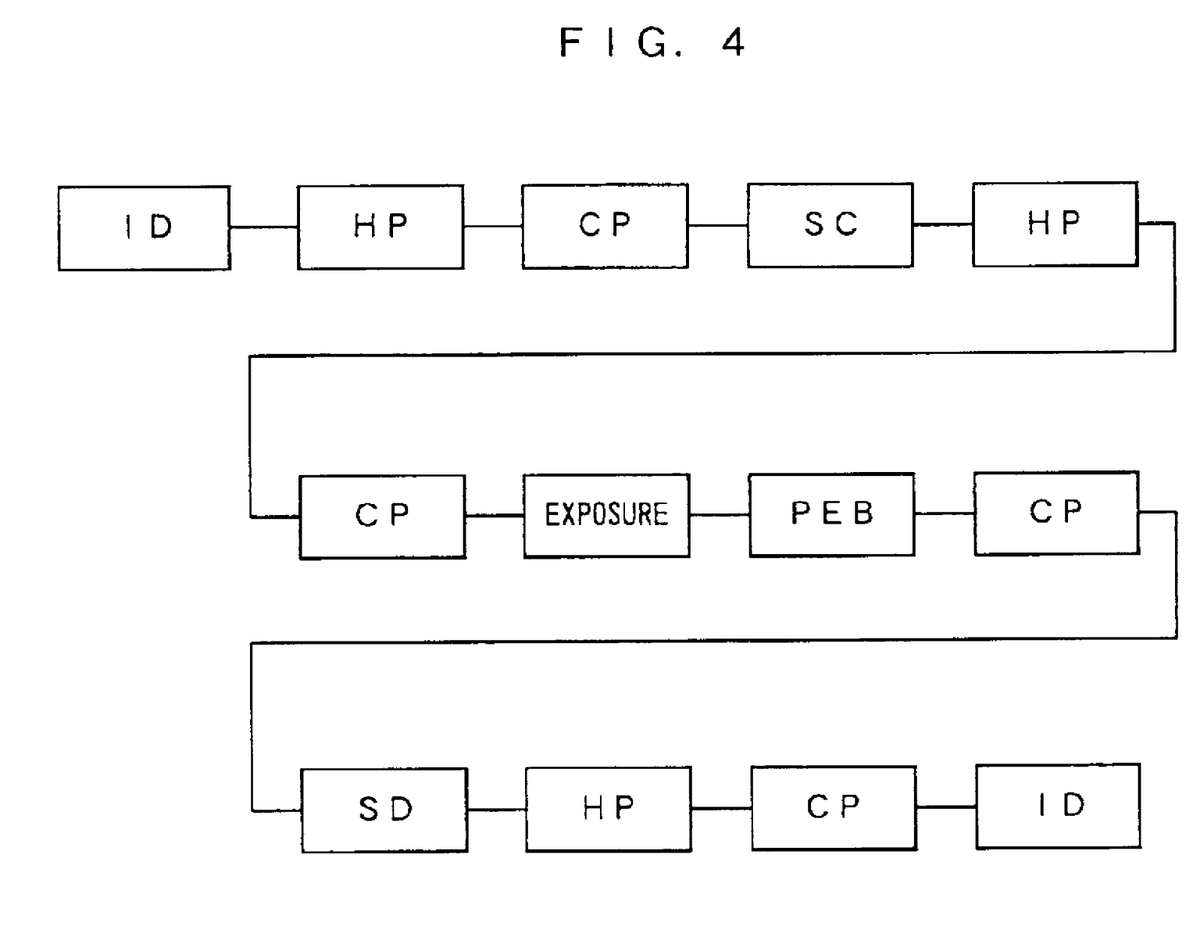
FIG. 4 is a chart of the sequence of steps in the substrate processing apparatus excluding the step of inspection.

Each of the processings in the substrate processing apparatus described above will now be described. FIG. 4 is a chart showing the process sequence excluding the step of inspection. The step of inspection will later be described.

A substrate yet to be processed that is stored in a carrier of the indexer ID is delivered to the transportation robot TR of the coating unit 10 by the indexer delivery unit IDF, and inserted in the heating device HP in the coating unit 10. In the heating device HP, heat-treatment for reinforcing the adhesion of resist coating is mainly performed. The substrate after the heat-treatment is inserted in the cooling device CP by the transportation robot TR of the cooling unit 10 for cooling and then inserted in the coater SC. Note that the four coaters SC can operate in parallel, and therefore a substrate can be inserted in any of these four coaters as desired. This also applies to the other processing devices.

The substrate after the resist coating at the coater SC is subjected to post-coating heat-treatment by the heating device HP and the cooling device CP in the coating unit 10. Then, the substrate is inserted in the exposure unit STP through the transportation robot TR of the developing unit 20 and the interface IFB. The substrate exposed for patterning by the exposure unit STP is returned to the transportation robot TR of the developing unit 20 through the interface IFB, and then inserted in the post-exposure baking device PEB in the developing unit 20. The post-exposure baking device PEB mainly performs heat treatment to activate an acid reaction after the exposure. The substrate after the post-exposure heat-treatment is inserted in the cooling device CP by the transportation robot TR of the developing unit 20 for cooling, and then inserted in the developer SD.

The substrate after the development in the developer SD is subjected to post-development heat-treatment by the heating device HP and the cooling device CP in the developing unit 20. Then, the substrate is delivered to the transportation robot TR of the coating unit 10 from the transportation robot TR of the developing unit 20, and then stored as a processed substrate in a carrier of the indexer ID through the indexer delivery unit IDF.

As described above, according to the embodiment, a substrate is transported by the two transportation robots TR among a plurality of processing devices according to the sequence of steps shown in FIG. 4, so that the substrate is coated with resist and developed. A set of substrates stored in one carrier included in the indexer ID are all subjected to the same processings as the two transportation robots TR sequentially transport the substrates according to the sequence of steps as shown in FIG. 4.

Figure 5:
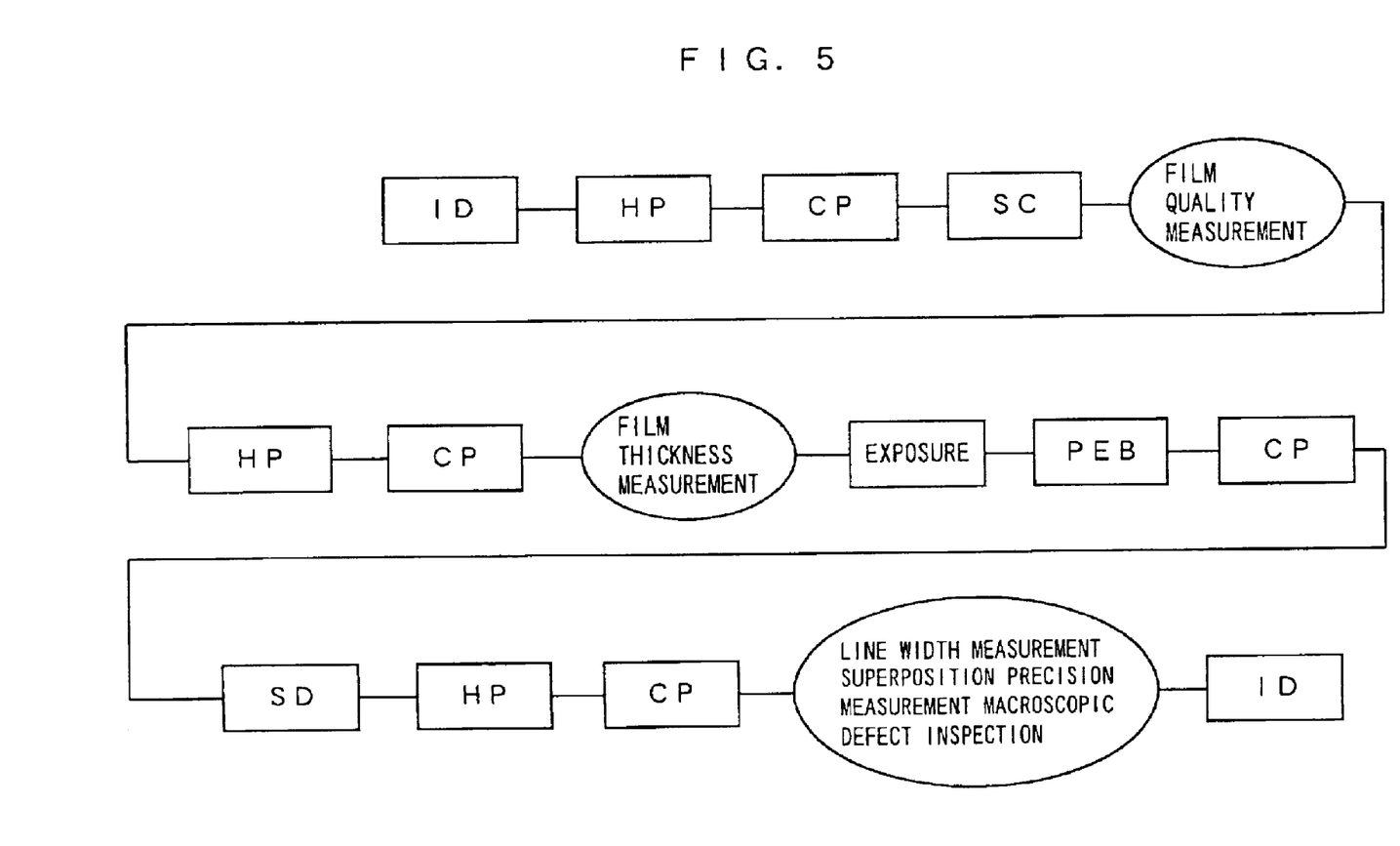
FIG. 5 is a chart of the sequence of steps in the substrate processing apparatus including the step of inspection.

The sequence of steps of processing a substrate including the inspection step will now be described. FIG. 5 shows an example of such a sequence of steps that includes the inspection step in addition to the sequence in FIG. 4.

As described above, the inspection unit 30 according to the embodiment includes the five inspection devices that perform inspections of different kinds to a substrate. As shown in FIG. 5, among these five kinds of inspections, the film quality measurement is performed after the resist coating and before the post-coating heat-treatment. The film thickness measurement is performed after the heat treatment following the resist coating and before the exposure. Meanwhile, the line width measurement, the superposition precision measurement and the macroscopic defect inspection are performed after the post-development heat-treatment and before returning the substrate to the indexer ID.

Here, according to the embodiment, these five kinds of inspections may selectively be performed. A substrate can be inserted in all the five inspection devices in the inspection unit 30 for all the kinds of inspections according to the sequence shown in FIG. 5. Some substrates may be inserted in only a part of the inspection unit 30 for corresponding inspections. Other substrates may not be inserted in any devices of the inspection unit 30 and may not be inspected at all.

Note that according to the embodiment, the coater SC, the developer SD, the heating devices HP, the cooling device CP and the post-exposure baking device PEB correspond to one or more processing devices. The film quality measuring device 32 corresponds to the film quality measuring device. The indexer ID, the indexer delivery unit IDF and the interface IFB correspond to the waiting location.

Now, the film quality measurement, the most characteristic feature of the invention will now be detailed. As in the foregoing, in this film quality measurement, the film quality of the photoresist applied on a substrate, in other words, the amount of solvent remaining in the film is measured.

As the processing dimension has shrunk, it has become more common to irradiate chemically amplified resist with a short-wavelength excimer laser beam and cause a chemical reaction as an exposure processing. At the time, the solvent remaining in the photoresist affects a chemical reaction (catalysis) by heat treatment after the exposure. When the amount of remaining solvent changes, the change affects the reaction rate and the line width uniformity can be lost. Therefore, the film quality measurement would be a crucial control item in reducing the line width fluctuation.

The film quality may directly be measured using a device that can analyze the remaining solvent amount such as a gas chromatography device and a Fourier transform infrared spectrophotometer. For the same resist, the remaining solvent amount and refractive index are correlated, quantitative measurement thereof may precede indirect measurement of the film quality using an ellipsometer that can measure optical characteristics such as a film thickness and a refractive index. When the remaining solvent amount is different, the density of the resist film, in other words, the ratio of the solute to the solvent is different. Therefore, the remaining solvent amount can be measured taking advantage of the fact that when a film is irradiated with light, the intensity of reflected light or transmitted light varies depending upon the density. Note that the solvent remaining amount changes as the film thickness changes, and therefore the film quality is preferably measured as the film thickness is controlled.

According to the embodiment, the film quality is measured after the resist coating and before the post-coating heat-treatment, while it may be measured after the post-coating heat-treatment and before the exposure, or after the exposure and before the post-exposure heat treatment.

According to the embodiment, the film quality is measured in the inspection unit 30 provided in the substrate processing apparatus, while it may be measured in a measuring device provided separately from the substrate processing apparatus. In this case, all the substrates do not have to be measured, but substrates whose number is at least large enough to secure prescribed reproducibility may be sampled for measurement.

As shown in FIG. 1, when a film quality measuring device is provided in the substrate processing apparatus, the inspection unit 30 including the film quality measuring device 32 is provided connected to both transportation paths 11 and 21 at the joint portion between the coating unit 10 and the developing unit 20. Meanwhile, the film quality measuring device for measuring the film quality may be provided in a waiting location for a substrate between the processings such as at the interface IFB, or on the transportation robots TR.

The film quality measuring device for measuring the film quality may be provided in each processing device. When the film quality measuring device is provided in the coater SC, the film quality can additionally be measured during the resist coating as compared to the case of using the independent inspection unit 30. When the film quality measuring device is provided in the heating device HP, the film quality can additionally be measured during the post-coating heat-treatment as compared to the case of using the independent inspection unit 30. When the film quality measuring device is provided in the exposure unit STP, the film quality can additionally be measured during the exposure process as compared to the case of using the independent inspection unit 30.

Figure 6:
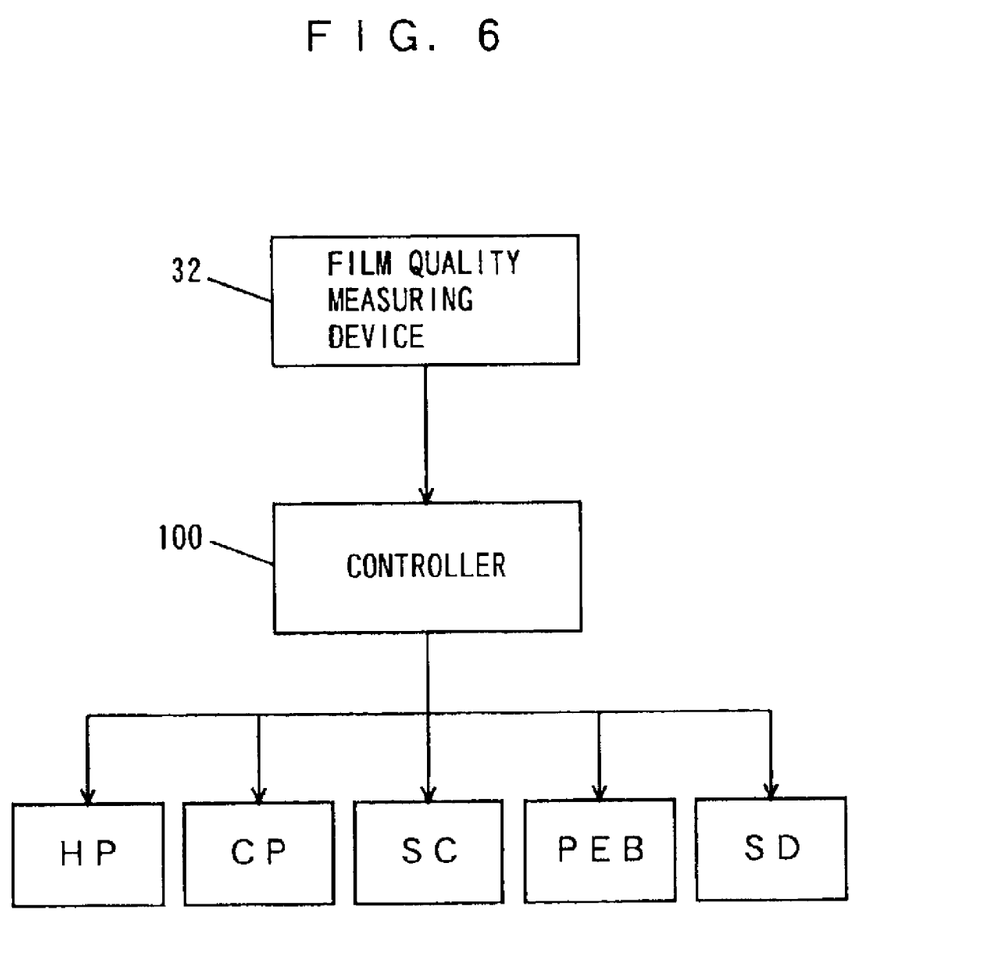
FIG. 6 is a block diagram of the configuration of a control system operating based on the measurement result by a film quality measuring device.

In this way, the processing condition may be controlled based on the measurement result of the film quality, and the measurement result can be used in the processings. FIG. 6 is a block diagram showing the configuration of a control system operating based on the measurement result by the film quality measuring device. The measurement result by the film quality measuring device 32 is transmitted to a controller 100. The controller 100 selects items used to control the processing condition based on the result of measurement from the film quality measuring device 32, and the processing condition is controlled for each processing device.

The items to control include various factors in the equipment environment such as the temperature in the cooling device CP before resist coating (i.e., the substrate temperature), the number of revolutions and time for revolution of the coater SC, the resist temperature, the resist viscosity, the temperature and the heating time in the heating device HP during the post-coating heat-treatment, the exposure value, the temperature and the heating time in the post-exposure baking device PEB, the temperature in the cooling device CP before development, the temperature of the developing agent, the time for developing, the amount of exhaust from the coater SC, and the temperature, humidity, and atmospheric pressure in the substrate processing apparatus or the like. One or more most suitable items to control depending on the sequence of inspection steps are selected and controlled.

When the film quality is measured after the resist coating as in the embodiment, feed forward control is performed to a substrate after measurement, and the temperature and the heating time in the heating device HP during the post-coating heat-treatment, the exposure value, the heating time and the heating temperature in the post-exposure baking device PEB, the temperature of the developing agent, the time for developing and the like are controlled. Then, feedback control is performed to substrates to be processed after this substrate, so that the substrate temperature, the number of revolutions and the time for revolution of the coater SC, the resist temperature, the resist viscosity and the like are controlled. The number of revolutions and the time for revolution of the coater SC, the temperature in the heating device HP during post-coating heat-treatment and the heating time thereof in particular are controlled, so that the remaining solvent amount in the resist film can directly be controlled.

In other process sequences, at least one of the above items to control is preferably subjected to feed forward or feedback control. When inspection is performed during each of processings such as resist coating, the ending time of the processing, the temperature and the like may be controlled as feed forward control, so that highly responsive control is enabled.

When the above control is performed, various data is preferably collected in the form of database in advance. The data includes for example the correlation between the remaining solvent amount after the resist coating and the heating time and temperature of post-exposure heat-treatment, and the correlation between the remaining solvent amount and the atmospheric pressure to control the number of revolutions and the time for revolution of the coater SC in the resist-coating process. Then, the control is preferably performed based on the database.

As in the foregoing, the film quality is measured and controlled, so that fluctuations in the line width can be reduced, which is not allowed only by controlling the film thickness. When the inspection device is provided in the substrate processing apparatus, the control in each processing is allowed, which can reduce the necessary number of steps and the cost accordingly. When the film quality measuring device is provided in the substrate processing apparatus, automatic control can be executed, and therefore troubles caused by human errors can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing method using a plurality of processing devices each performing a prescribed processing to a substrate, comprising the steps of:
   coating a substrate with a processing liquid including a solvent and a solute using at least one of said plurality of processing devices;
   performing heat-treatment to a substrate coated with said processing liquid;
   measuring the amount of solvent remaining in the film of said processing liquid applied on the substrate, after said coating of said processing liquid and before said heat-treatment;
   inspecting a thickness of the film formed on the substrate, after said heat-treatment, to control the film thickness; and
   controlling a processing condition in at least one of said plurality of processing devices based on a measurement result of said amount of solvent, to control the amount of solvent remaining in the film.

2. The substrate processing method according to claim 1, wherein
   said step of coating with the processing liquid includes coating the substrate with a resist solution as said processing liquid,
   said step of measuring the amount of solvent remaining in the film includes measuring the amount of solvent remaining in the film of the resist solution on the substrate.

3. The substrate processing method according to claim 1, wherein
   said step of controlling includes controlling a processing condition in a processing before measurement based on the measurement result of said amount of solvent remaining in the film.

4. The substrate processing method according to claim 1, wherein
   said step of controlling includes controlling a processing condition in a processing after measurement based on the measurement result of said amount of solvent remaining in the film.

5. The substrate processing method according to claim 1, further comprising the step of performing another processing to said coated substrate by at least another of said plurality of processing devices,
   said step of measuring the amount of solvent remaining in the film including measuring said amount of solvent remaining in the film in said at least one or said at least another of said plurality of processing devices.

6. The substrate processing method according to claim 5, wherein
   said step of measuring the amount of solvent remaining in the film includes measuring the amount of solvent remaining in the film during or after coating with said processing liquid; or before, during or after said other processing.

7. The substrate processing method according to claim 1, further comprising the step of transporting a substrate to said plurality of processing devices by a transportation device,
   said step of measuring the amount of solvent remaining in the film including measuring said amount of solvent remaining in the film in said transportation device.

8. The substrate processing method according to claim 1, wherein
   said step of measuring the amount of solvent remaining in the film includes measuring said amount of solvent remaining in the film while said substrate is waiting in a waiting location.

9. A substrate processing apparatus, comprising:
   a plurality of processing devices each performing a prescribed processing to a substrate,
   said plurality of processing devices including a coater that coats a substrate with a processing liquid including a solvent and a solute, and a heat-treatment device that performs heat-treatment to a substrate coated with said processing liquid by said coater;
   a film quality measuring device that measures the amount of solvent remaining in the film of the processing liquid applied on the substrate by said coater, after the coating of said processing liquid by said coater and before the heat-treatment by said heat-treatment device;
   an inspection device that inspects a thickness of the film formed on the substrate, after the heat-treatment by said heat-treatment device, to control the film thickness; and
   a controller that controls a processing condition in at least one of said plurality of processing devices based on a result of measurement by said film quality measuring device, to control the amount of solvent remaining in the film.

10. The substrate processing apparatus according to claim 9, wherein
    said coater coats the substrate with a resist solution as said processing liquid, and
    said film quality measuring device measures the amount of solvent remaining in the film of the resist solution on the substrate as said film quality.

11. The substrate processing apparatus according to claim 9, wherein
said controller controls a processing condition in a processing before measurement based on the result of measurement by said film quality measuring device.

12. The substrate processing apparatus according to claim 9, wherein
said controller controls a processing condition in a processing after measurement based on the result of measurement by said film quality measuring device.

13. The substrate processing apparatus according to claim 9, wherein
said plurality of processing devices include another processing device that performs another processing to a substrate processed by said coater, and
said film quality measuring device is provided in said coater or said other processing device.

14. The substrate processing apparatus according to claim 13, wherein
said film quality measuring device measures said film quality during or after the processing by said coater; or before, during or after the processing by said other processing device.

15. The substrate processing apparatus according to claim 9, further comprising a transportation device that transports a substrate to said plurality of processing devices,
said film quality measuring device being provided at said transportation device.

16. The substrate processing apparatus according to claim 9, further comprising a waiting location where a substrate waits, said film quality measuring device being provided in said waiting location.

* * * * *